(12) United States Patent
Tagashira

(10) Patent No.: US 11,277,931 B2
(45) Date of Patent: Mar. 15, 2022

(54) CONTROL DEVICE

(71) Applicant: KAWASAKI JUKOGYO KABUSHIKI KAISHA, Kobe (JP)

(72) Inventor: Tsuyoshi Tagashira, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 59 days.

(21) Appl. No.: 16/489,304

(22) PCT Filed: Feb. 27, 2018

(86) PCT No.: PCT/JP2018/007261
§ 371 (c)(1),
(2) Date: Aug. 27, 2019

(87) PCT Pub. No.: WO2018/155708
PCT Pub. Date: Aug. 30, 2018

(65) Prior Publication Data
US 2020/0068739 A1 Feb. 27, 2020

(30) Foreign Application Priority Data

Feb. 27, 2017 (JP) .............................. JP2017-034989

(51) Int. Cl.
*H05K 7/00* (2006.01)
*H05K 7/14* (2006.01)
(52) U.S. Cl.
CPC ......... *H05K 7/1429* (2013.01); *H05K 7/1435* (2013.01)

(58) Field of Classification Search
CPC .............................. H05K 7/1429; H05K 7/143
See application file for complete search history.

(56) References Cited

U.S. PATENT DOCUMENTS 4,604,689 A * 8/1986 Burger .................... G06F 13/37
710/300
6,237,056 B1 * 5/2001 Lam .................... G06F 13/4072
710/106

(Continued)

FOREIGN PATENT DOCUMENTS

JP   H09-325839 A   12/1997
JP   2007-148540 A   6/2007

(Continued)

OTHER PUBLICATIONS (JP 2007-148540 English Translation hereinafter Kasai) (Year: 2007).*

*Primary Examiner* — Pete T Lee
(74) *Attorney, Agent, or Firm* — Oliff PLC

(57) ABSTRACT

A control device includes a casing and a control circuit substrate arranged inside the casing. The control circuit substrate includes: a control circuit mounted on the control circuit substrate; an internal connector connectable to a communication cable inside the casing, the communication cable being connected to an expansion circuit substrate; and an external connector connectable to another communication cable outside the casing, the another communication cable being connected to another expansion circuit substrate. The control circuit is connected to the internal connector and the external connector in parallel.

7 Claims, 6 Drawing Sheets

(56) References Cited

U.S. PATENT DOCUMENTS

| | | | | |
|---|---|---|---|---|
| 7,457,250 | B2* | 11/2008 | Austermann, III | H04B 3/54 370/241 |
| 7,544,077 | B1* | 6/2009 | Martin | H01R 25/161 200/16 R |
| 2004/0015637 | A1 | 1/2004 | Yau | |
| 2004/0224627 | A1* | 11/2004 | Becelaere | F24F 11/0001 454/257 |
| 2006/0101186 | A1* | 5/2006 | Lee | G06F 13/102 710/313 |
| 2006/0274073 | A1* | 12/2006 | Johnson | G06F 1/184 345/531 |
| 2011/0134792 | A1* | 6/2011 | Andersson | H04L 12/2838 370/254 |
| 2015/0043173 | A1* | 2/2015 | Yoon | H05K 7/1457 361/729 |

FOREIGN PATENT DOCUMENTS

| | | |
|---|---|---|
| JP | 2009-278858 A | 11/2009 |
| JP | 2012-206240 A | 10/2012 |
| JP | 2012-256768 A | 12/2012 |

\* cited by examiner

CONTROL DEVICE

TECHNICAL FIELD

The present invention relates to a control device, such as a robot controller.

BACKGROUND ART

In recent years, there is an increasing need for high expandability and downsizing of control devices that support social infrastructure/public system products and the like. For example, PTL 1 discloses a control device including a casing in which a plurality of expansion I/O boards can be arranged.

CITATION LIST

Patent Literature

PTL 1: Japanese Laid-Open Patent Application Publication No. 2012-256768

SUMMARY OF INVENTION

Technical Problem

However, since the conventional control device is configured such that the expansion I/O boards are arranged inside the casing, an adequate space needs to be secured inside the casing. As a result, increases in size and weight of the device are unavoidable, and expansion work performed by a user becomes complex. Such problems are common among control devices, such as robot controllers, having high expandability.

The present invention was made to solve the above problems, and an object of the present invention is to facilitate the expansion work of a user while realizing downsizing of a control device, such as a robot controller, having high expandability.

Solution to Problem

To achieve the above object, a control device according to one aspect of the present invention includes: a casing; and a control circuit substrate arranged inside the casing, wherein: the control circuit substrate includes a control circuit mounted on the control circuit substrate, an internal connector connectable to a communication cable inside the casing, the communication cable being connected to an expansion circuit substrate, and an external connector connectable to another communication cable outside the casing, the another communication cable being connected to another expansion circuit substrate; and the control circuit is connected to the internal connector and the external connector in parallel.

According to the above configuration, the control circuit substrate includes the connectors that are connectable to the expansion circuit substrate and provided inside and outside the casing. Therefore, the expansion circuit substrate can be connected to the control circuit substrate not only inside the casing but also outside the casing. Thus, expansion work performed by a user is facilitated. This can contribute to the downsizing of the control device as compared to a conventional configuration in which the expansion circuit substrate is arranged only inside the casing.

The control circuit substrate may further include a termination resistor arranged between a pair of signal wires, and a relay circuit configured to switch the termination resistor between effective and ineffective. At least one of the internal connector and the external connector may be defined as a specific connector, and each of connectors of the communication cables connected to the respective expansion circuit substrates may be defined as a cable connector, the connector being located close to the control circuit substrate. One of output terminals of the relay circuit may be connected to the termination resistor, and the other of the output terminals of the relay circuit may be connected to one of the signal wires. When the specific connector and the cable connector are in a disconnected state, the relay circuit may be in an ON state, and an output current may flow, and this may make the termination resistor effective. When the specific connector and the cable connector are in a connected state, the relay circuit may be switched to an OFF state, and the output current may stop, and this may make the termination resistor ineffective.

According to the above configuration, the control circuit substrate includes the relay circuit configured to switch the termination resistor between effective and ineffective. Therefore, regardless of the inside and outside of the casing, the termination resistor that terminates a pair of signal wires can switch between ineffective and effective by connection/disconnection between the connector and the cable connector. On this account, work of attaching the termination resistor and switching the termination resistor becomes unnecessary in the expansion work of the substrate. Thus, the expansion work performed by a user is facilitated.

The specific connector may include signal terminals connected to the respective signal wires, a first terminal connected to one of input terminals of the relay circuit, and a second terminal connected to the other of the input terminals of the relay circuit. The cable connector may include signal terminals connected to the respective signal terminals of the specific connector, and two short circuit terminals that are short-circuited inside the cable connector. The one input terminal of the relay circuit may be connected to a DC voltage supply terminal. The other input terminal of the relay circuit may be connected to a ground terminal. When the specific connector and the cable connector are in a disconnected state, an input current may flow between the input terminals of the relay circuit, and the relay circuit may be in an ON state. When the specific connector and the cable connector are in a connected state, the first terminal and the second terminal may be short-circuited through the short circuit terminals, and the relay circuit may be switched to an OFF state.

Inside the casing, the control circuit substrate may be connectable to at least the two expansion circuit substrates through the communication cables and be arranged parallel to these expansion circuit substrates.

According to the above configuration, even when, for example, two expansion circuit substrates are arranged inside the casing, the two expansion circuit substrates can be connected to each other through the communication cable, and therefore, flexible substrate arrangement can be realized. When these expansion circuit substrates are arranged parallel to the control circuit substrate, this can contribute to the downsizing of the control device.

Advantageous Effects of Invention

The control device of the present invention is configured as described above and can facilitate expansion work of a user while realizing downsizing of a control device, such as a robot controller, having high expandability.

DESCRIPTION OF EMBODIMENTS

Figure 1:
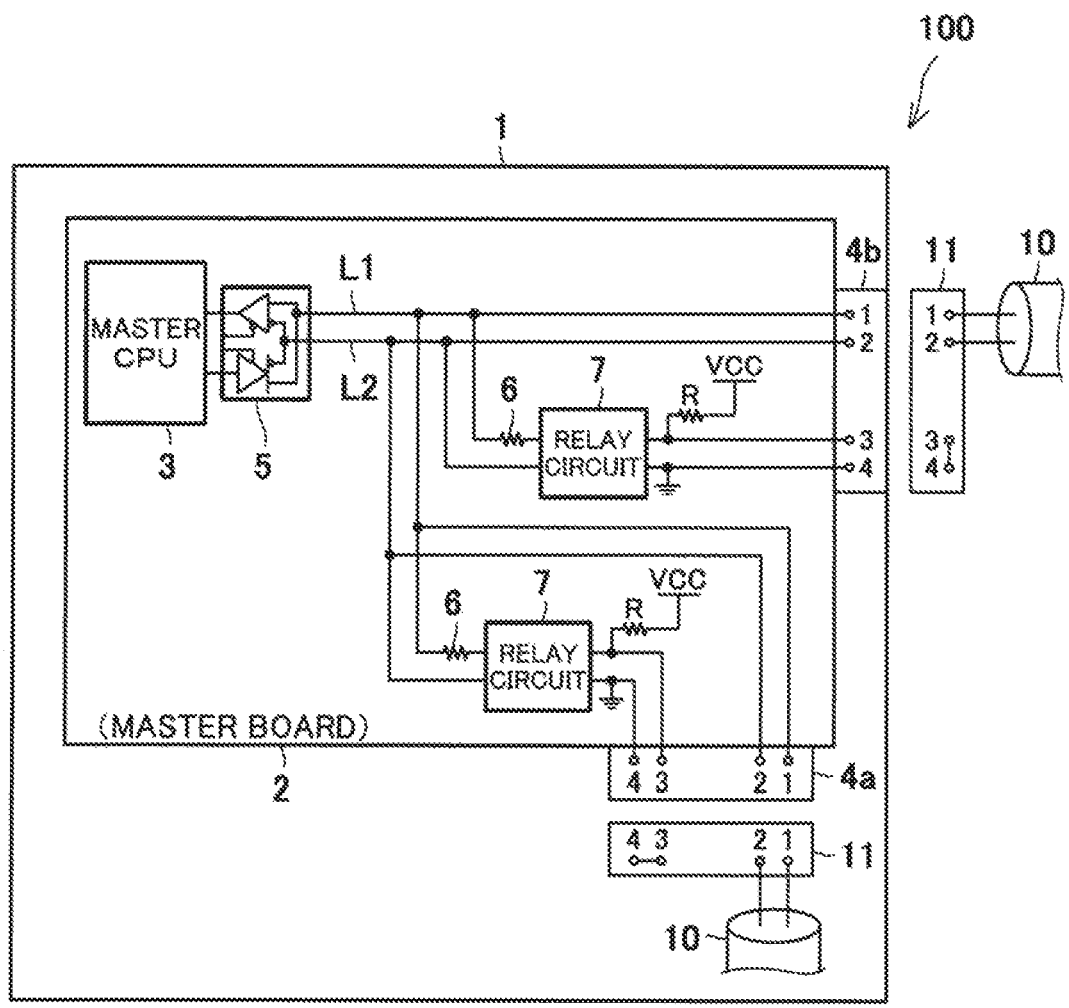
FIG. 1 is a configuration diagram of a control device according to one embodiment of the present invention.

Hereinafter, a preferred embodiment will be described with reference to the drawings. In the following description and the drawings, the same reference signs are used for the same or corresponding components, and a repetition of the same explanation is avoided. For ease of understanding, components are schematically shown in the drawings.

FIG. 1 is a configuration diagram of a control device according to one embodiment of the present invention. As shown in FIG. 1, a control device 100 includes a casing 1 and a control circuit substrate 2 arranged inside the casing 1. In the present embodiment, the control device 100 is a robot controller. The robot controller controls a drive voltage of a motor of a robot based on an input signal supplied from a difference device. When the robot controller controls a frequency of a control signal input to a motor driver, a current corresponding to a driving amount of the motor is supplied to each phase of the motor (not shown).

The control circuit substrate 2 includes a control circuit 3, a differential transceiver 5, termination resistors 6, relay circuits 7, an internal connector 4a, and an external connector 4b.

The control circuit 3 generates a control signal (PWM signal) for controlling an output voltage of the motor driver based on a rotational position of the motor. The control circuit 3 then outputs the control signal (PWM signal) to the motor driver. The motor driver converts the output voltage of a power supply circuit into a multiphase AC voltage and outputs the multiphase AC voltage to the motor. The power supply circuit converts the AC voltage into a DC voltage and outputs the DC voltage to the motor driver. The control circuit 3 may be mounted on a circuit substrate different from a circuit substrate on which the motor driver and/or the power supply circuit is mounted, or the control circuit 3 may be mounted on the same circuit substrate as the motor driver and/or the power supply circuit.

In addition to the above function of controlling the robot, the control circuit 3 has an expansion function for controlling input and output of various sensors in robot control. In the present embodiment, the control circuit 3 is connected to the internal connector 4a and the external connector 4b in parallel through the differential transceiver 5 and signal wires (L1, L2). The control circuit 3 is a master CPU mounted on a master board. The control circuit 3 is configured to perform differential serial transmission of half-duplex communication with a slave CPU (expansion circuit) mounted on a slave board (first expansion circuit substrate) at an inside of the casing 1 by the differential transceiver 5 and with a slave CPU (expansion circuit) mounted on a slave board (second expansion circuit substrate) at an outside of the casing 1 by the differential transceiver 5. Hereinafter, the control circuit, the control circuit substrate, the first and second expansion circuit substrates, and the expansion circuit may be referred to as a master board, a master CPU, slave boards, and a slave CPU, respectively.

The internal connector 4a is connected to a communication cable 10 in the casing 1. The internal connector 4a includes: signal terminals (1, 2) connected to the respective signal wires (L1, L2); a first terminal (3) connected to one of input terminals of the relay circuit 7; and a second terminal (4) connected to the other of the input terminals of the relay circuit 7. The internal connector 4a is connected to a cable connector 11 of the communication cable 10 inside the casing 1, the cable connector 11 being located close to the control circuit substrate 2.

The external connector 4b is connected to the communication cable 10 outside the casing 1. The external connector 4b includes: signal terminals (1, 2) connected to the respective signal wires (L1, L2); a first terminal (3) connected to one of input terminals of the relay circuit 7; and a second terminal (4) connected to the other of the input terminals of the relay circuit 7. The external connector 4b is connected to a cable connector 11 of the communication cable 10 outside the casing 1, the cable connector 11 being located close to the control circuit substrate 2. Hereinafter, the internal connector 4a and the external connector 4b may be collectively called a connector (specific connector) 4.

The connector (hereinafter may be referred to as a "cable connector") 11 of the communication cable 10 includes: signal terminals (1, 2) connected to the respective signal terminals (1, 2) of the connector 4; and two short circuit terminals (3, 4) that are short-circuited in the connector 11.

Each of the termination resistors 6 is arranged between a pair of signal wires (L1, L2). In the present embodiment, two termination resistors 6 are mounted on the control circuit substrate 2. One of the termination resistors 6 terminates the signal wires (L1, L2) connected to the internal connector 4a, and the other of the termination resistors 6 terminates the signal wires (L1, L2) connected to the external connector 4b.

Each of the relay circuits 7 switches the termination resistor 6 between effective and ineffective. In the present embodiment, two relay circuits 7 are mounted on the control circuit substrate 2. One of the relay circuits 7 switches the termination resistor 6 connected to the internal connector 4a between effective and ineffective, and the other of the relay circuits 7 switches the termination resistor 6 connected to the external connector 4b between effective and ineffective. Next, the specific configurations of the relay circuits 7 will be described with reference to FIG. 2. Since these two relay circuits 7 are the same in configuration as each other, only one relay circuit 7 will be described herein.

Figure 2:
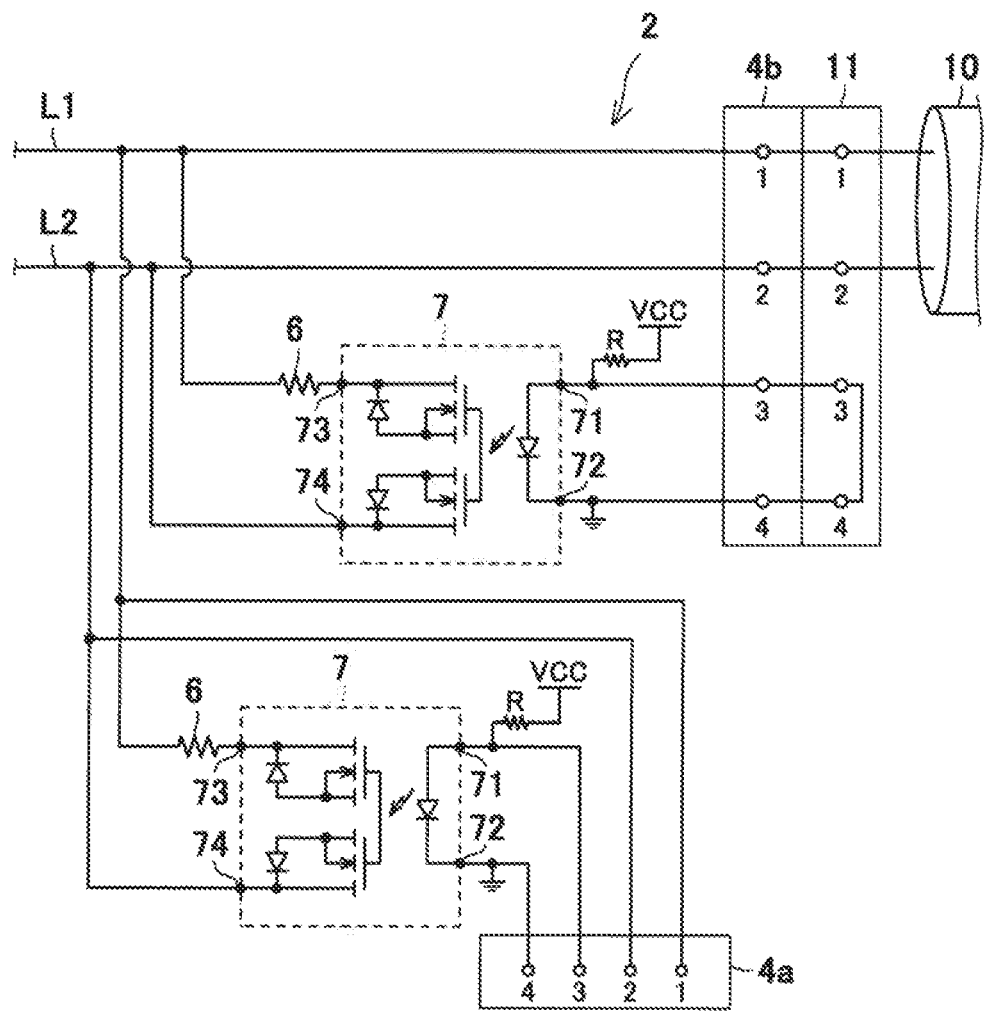
FIG. 2 is a circuit diagram showing the configurations of relay circuits shown in FIG. 1.

As shown in FIG. 2, the relay circuit 7 of the present embodiment is a photo MOS relay. The photo MOS relay is constituted by: a light emitting element (LED) as an input side; and a MOSFET and a light receiving element as output sides. In the relay circuit 7, an anode-side input terminal 71 is connected to a DC voltage supply terminal VCC through a resistor R, and a cathode-side input terminal 72 is connected to a ground terminal. In the relay circuit 7, an output terminal 73 is connected to the signal line L1 through the termination resistor 6, and an output terminal 74 is connected to the signal line L2.

The following will describe a case where the connector 4 and the cable connector 11 are in a disconnected state. As shown in FIG. 2, the internal connector 4a and the cable connector 11 are in the disconnected state. The first terminal (3) and the second terminal (4) in the internal connector 4a are not short-circuited, and a forward voltage is supplied to the input-side light emitting element (LED) of the relay circuit 7. With this, the LED emits light, and an input current flows between the input terminals (71, 72). The relay circuit 7 becomes an ON state. When the relay circuit 7 is in the ON state, the output-side light receiving element receives the light of the LED, and the MOSFET conducts electricity. An output current flows between the output terminals (73, 74). As a result, the termination resistor 6 becomes effective.

Next, the following will describe a case where the connector 4 and the cable connector 11 are in a connected state. As shown in FIG. 2, the external connector 4b and the cable connector 11 are in the connected state. The first terminal (3) and the second terminal (4) in the external connector 4b are short-circuited through the short circuit terminals (3, 4) of the cable connector 11, and the forward voltage is not supplied to the input-side light emitting element (LED). Therefore, the LED does not emit light, and the input current does not flow between the input terminals (71, 72). The relay circuit 7 is switched to an OFF state. When the relay circuit 7 is in the OFF state, the output-side light receiving element does not receive the light of the LED, and therefore, the MOSFET does not conduct electricity. The output current does not flow between the output terminals (73, 74). As a result, the termination resistor 6 becomes ineffective.

Figure 3:
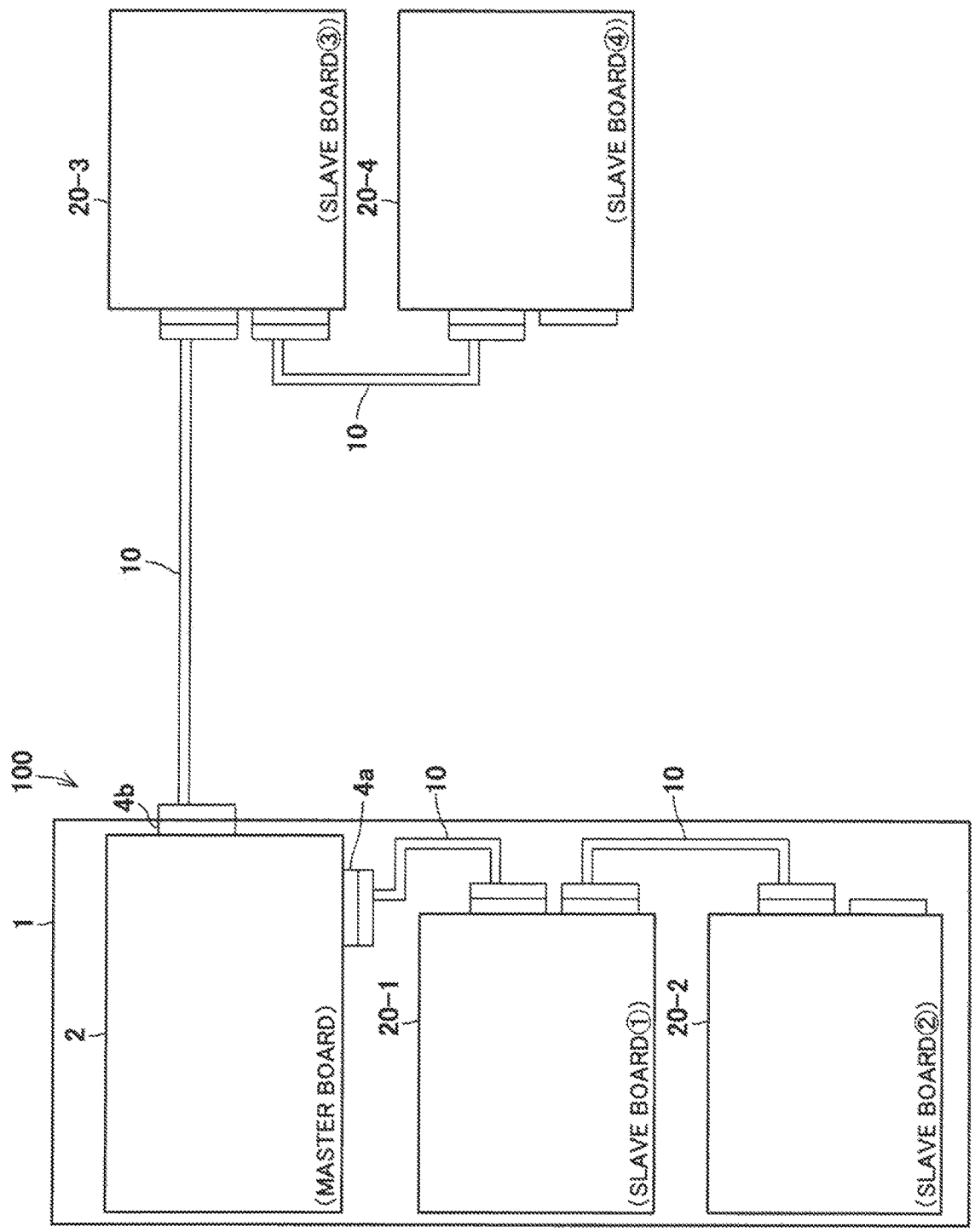
FIG. 3 is a diagram showing one example of the configuration of a network of the control device shown in FIG. 1.

Next, the configuration of a network connected to the control device 100 will be described with reference to FIG. 3. As shown in FIG. 3, four slave boards 20-1, 20-2, 20-3, and 20-4 are connected to a master board (2) of the control device 100. Hereinafter, the slave boards 20-1 to 20-4 may be collectively called a slave board 20. Inside the casing 1 of the control device 100, the two slave boards 20-1 and 20-2 are daisy-chained to the internal connector 4a of the master board (2) through the communication cables 10. Outside the casing 1 of the control device 100, the two slave boards 20-3 and 20-4 are daisy-chained to the external connector 4b of the master board (2) through the communication cables 10.

Figure 4:
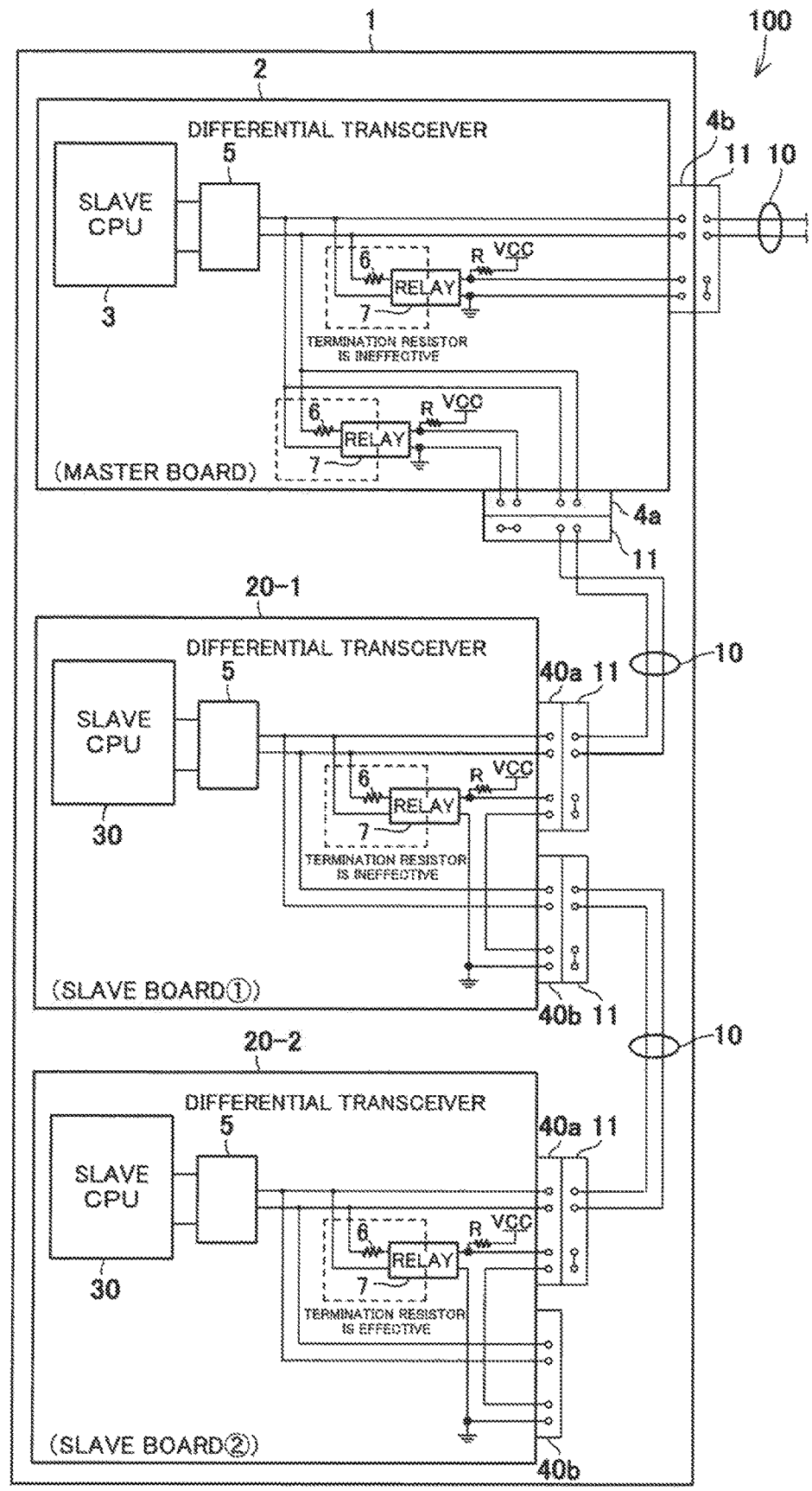
FIG. 4 is a diagram showing components inside the control device shown in FIG. 3.

FIG. 4 is a diagram showing components inside the control device 100. As shown in FIG. 4, inside the casing 1 of the control device 100, the internal connector 4a of the master board (2) is connected to the cable connector 11 of the communication cable 10 connected to the slave board 20-1.

Since the internal connector 4a of the master board (2) and the cable connector 11 are in the connected state, the relay circuit 7 connected to the internal connector 4a is in the OFF state, and the termination resistor 6 connected to the internal connector 4a becomes ineffective. On the other hand, since the external connector 4b of the master board (2) and the cable connector 11 are also in the connected state, the relay circuit 7 connected to the external connector 4b is also in the OFF state, and the termination resistor 6 connected to the external connector 4b also becomes ineffective.

The slave board 20-1 includes a slave CPU 30, the differential transceiver 5, the termination resistor 6, the relay circuit 7, a first connector 40a, and a second connector 40b. It should be noted that since the configurations of the differential transceiver 5, the termination resistor 6, and the relay circuit 7 are the same as the above-described configurations, explanations thereof are omitted. Since the four slave boards 20-1 to 20-4 are the same in configuration as each other, only the slave board 20-1 will be described herein.

The first connector 40a of the slave board 20-1 is in connection with the cable connector 11 of the communication cable 10 connected to the internal connector 4a of the master board (2), and the second connector 40b of the slave board 20-1 is in connection with the cable connector 11 of the communication cable 10 connected to the first connector 40a of the slave board 20-2. With this, the relay circuit 7 of the slave board 20-1 becomes the OFF state, and the termination resistor 6 of the slave board 20-1 becomes ineffective.

The first connector 40a of the slave board 20-2 is in connection with the cable connector 11 of the communication cable 10 connected to the second connector 40b of the slave board 20-1, and the second connector 40b of the slave board 20-2 is in a disconnected state. With this, the relay circuit 7 of the slave board 20-2 becomes the ON state, and the termination resistor 6 becomes effective.

Figure 5:
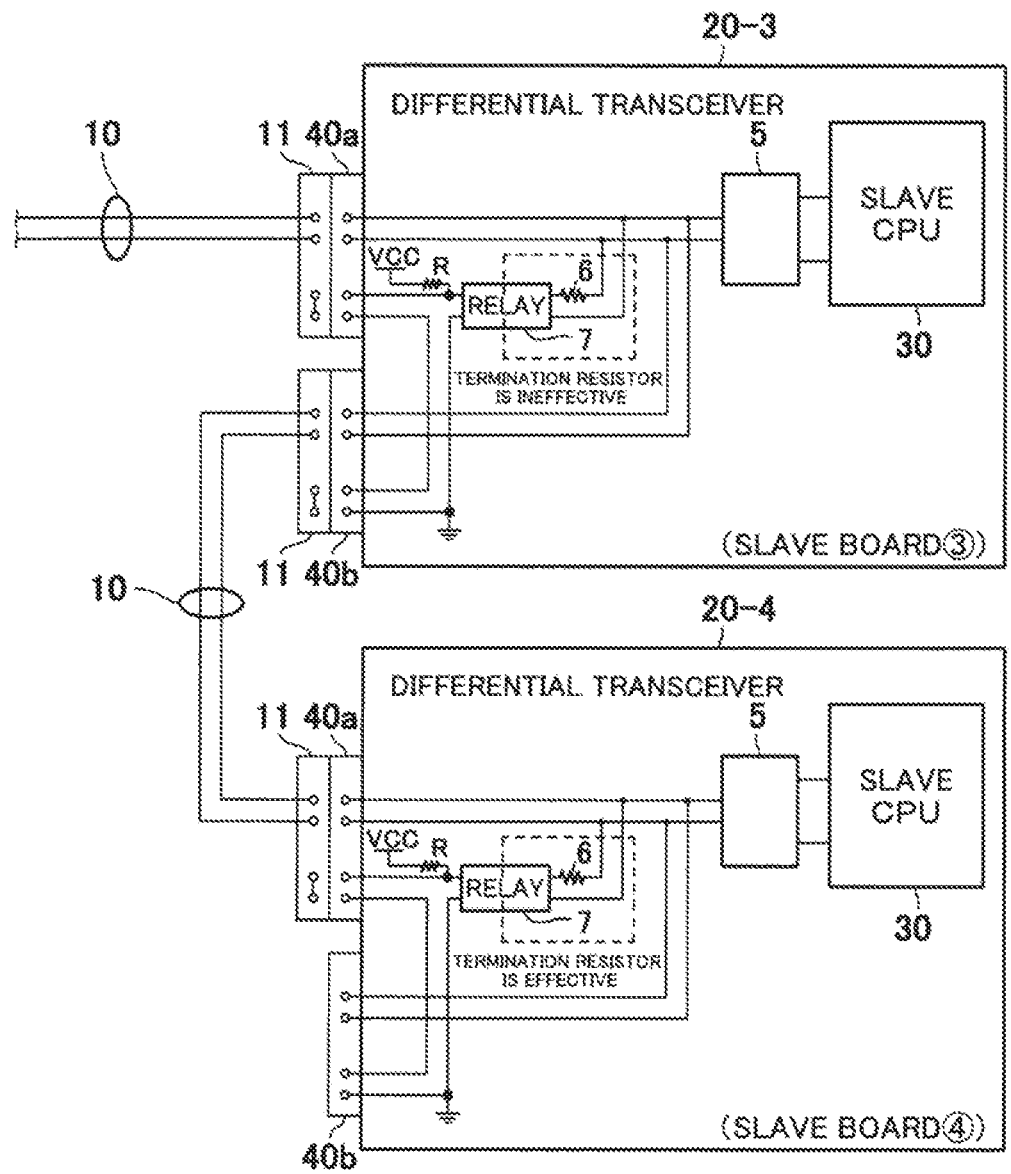
FIG. 5 is a diagram showing components outside the control device shown in FIG. 3.

FIG. 5 is a diagram showing components outside the control device 100. As shown in FIG. 5, outside the casing 1 of the control device 100, the first connector 40a of the slave board 20-3 is in connection with the cable connector 11 of the communication cable 10 connected to the external connector 4b of the master board (2), and the second connector 40b of the slave board 20-3 is in connection with the cable connector 11 of the communication cable 10 connected to the first connector 40a of the slave board 20-4. With this, the relay circuit 7 of the slave board 20-3 becomes the OFF state, and the termination resistor 6 becomes ineffective.

The first connector 40a of the slave board 20-4 is in connection with the cable connector 11 of the communication cable 10 connected to the second connector 40b of the slave board 20-3, and the second connector 40b of the slave board 20-4 is in a disconnected state. With this, the relay circuit 7 of the slave board 20-4 becomes the ON state, and the termination resistor 6 of the slave board 20-4 becomes effective.

Therefore, according to the present embodiment, the master board (2) includes the connectors 4 that are connectable to the slave board 20 and provided inside and outside the casing 1. Therefore, the slave boards 20 can be daisy-chained to the master board (2) not only inside the casing 1 but also outside the casing 1. Further, the relay circuits 7 are included on the master board (2). Therefore, regardless of the inside and outside of the casing 1, the termination resistor 6 can switch between ineffective and effective by connection/disconnection between the connector 4 and the cable connector 11.

Conventionally, a plurality of (four, for example) slave boards 20 are accommodated inside the casing 1 of the control device 100. Therefore, an adequate space needs to be secured inside the casing 1. On this account, increases in size and weight of the apparatus are unavoidable, and expansion work performed by a user becomes complex.

Figure 6:
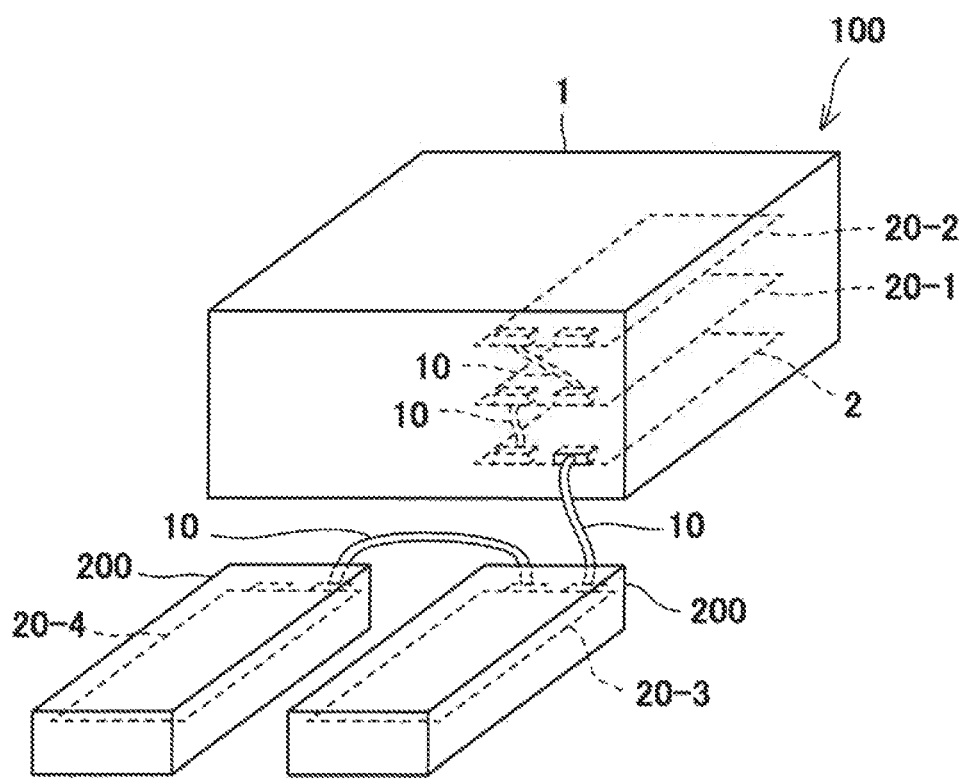
FIG. 6 is a perspective view schematically showing an appearance of the control device shown in FIG. 3.

However, according to the control device 100 of the present embodiment, as shown in FIG. 6, inside the casing 1, the master board (2) is connected through the communication cables 10 to the two slave boards 20-1 and 20-2, and outside the casing 1, the master board (2) is connected through the communication cables 10 to the two slave boards 20-3 and 20-4 accommodated in respective external devices 200. Since the two slave boards 20-1 and 20-2 are connected to each other through the communication cable 10, flexible substrate arrangement can be realized inside the casing 1. Herein, since the slave boards 20-1 and 20-2 are arranged parallel to the master board (2), this can contribute to the downsizing of the control device 100.

In the present embodiment, two slave boards 20 are included inside the casing 1 (see FIG. 6). However, three or more slave boards 20 may be included inside the casing 1.

In the present embodiment, the relay circuit 7 is constituted by the photo MOS relay (see FIG. 2). However, the relay circuit 7 may be constituted by a different circuit (mechanical relay, for example) as long as the circuit has the above function of switching the termination resistor 6 between effective and ineffective.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

The present invention is useful for control devices, such as robot controllers.

REFERENCE SIGNS LIST

1 casing
2 control circuit substrate (master board)
3 master CPU (control circuit)
4 connector (master CPU)
4a internal connector
4b external connector
5 differential transceiver
6 termination resistor
7 relay circuit
10 communication cable
11 cable connector
20, 20-1 to 20-4 slave board (expansion circuit substrate)
20-1, 20-2 slave board (first expansion circuit substrate inside casing)
20-3, 20-4 slave board (second expansion circuit substrate outside casing)
30 slave CPU
100 control device (robot controller)
200 external device

The invention claimed is:

1. A control device comprising:
a casing; and
a control circuit substrate arranged inside the casing, wherein:
the control circuit substrate includes all of:
a control circuit mounted on the control circuit substrate,
an internal connector connectable to a communication cable connected to a first expansion circuit substrate arranged inside the casing, and
an external connector connectable to another communication cable connected to a second expansion circuit substrate arranged outside the casing, so that the internal connector and the external connector are both mounted on the control circuit substrate; and
the control circuit is connected to the internal connector and the external connector in parallel.

2. The control device according to claim 1, wherein:
the control circuit substrate further includes
a termination resistor arranged between a pair of signal wires, and
a relay circuit configured to switch the termination resistor between effective and ineffective;
at least one of the internal connector and the external connector is defined as a specific connector;
each of connectors of the communication cables connected to the first and second expansion circuit substrates is defined as a cable connector, the connector being located close to the control circuit substrate;
one of output terminals of the relay circuit is connected to the termination resistor;
the other of the output terminals of the relay circuit is connected to one of the signal wires;
when the specific connector and the cable connector are in a disconnected state, the relay circuit is in an ON state, and an output current flows, and this makes the termination resistor effective; and
when the specific connector and the cable connector are in a connected state, the relay circuit is switched to an OFF state, and the output current stops, and this makes the termination resistor ineffective.

3. The control device according to claim 2, wherein:
the specific connector includes
signal terminals connected to the respective signal wires,
a first terminal connected to one of input terminals of the relay circuit, and
a second terminal connected to the other of the input terminals of the relay circuit;
the cable connector includes
signal terminals connected to the respective signal terminals of the specific connector, and
two short circuit terminals that are short-circuited inside the cable connector;
the one input terminal of the relay circuit is connected to a DC voltage supply terminal;
the other input terminal of the relay circuit is connected to a ground terminal;
when the specific connector and the cable connector are in a disconnected state, an input current flows between the input terminals of the relay circuit, and the relay circuit is in an ON state; and
when the specific connector and the cable connector are in a connected state, the first terminal and the second terminal are short-circuited through the short circuit terminals, and the relay circuit is switched to an OFF state.

4. The control device according to claim 1, wherein:
inside the casing, the control circuit substrate is able to be daisy-chained to at least two inside expansion circuit substrates including the first expansion circuit substrate;
adjacent two of the control circuit substrate and the at least two inside expansion circuit substrates are connectable to each other through a communication cable; and
the control circuit substrate is arranged parallel to the at least two inside expansion circuit substrates.

5. The control device according to claim 2, wherein:
inside the casing, the control circuit substrate is able to be daisy-chained to at least two inside expansion circuit substrates including the first expansion circuit substrate;
adjacent two of the control circuit substrate and the at least two inside expansion circuit substrates are connectable to each other through a communication cable; and the control circuit substrate is arranged parallel to the at least two inside expansion circuit substrates.

6. The control device according to claim 3, wherein:

inside the casing, the control circuit substrate is able to be daisy-chained to at least two inside expansion circuit substrates including the first expansion circuit substrate;

adjacent two of the control circuit substrate and the at least two inside expansion circuit substrates are connectable to each other through a communication cable; and the control circuit substrate is arranged parallel to the at least two inside expansion circuit substrates.

7. The control device according to claim 1, wherein:

outside the casing, the control circuit substrate is able to be daisy-chained to at least two outside expansion circuit substrates including the second expansion circuit substrate;

adjacent two of the control circuit substrate and the at least two outside expansion circuit substrates are connectable to each other through a communication cable; and the control circuit substrate is arranged parallel to the at least two outside expansion circuit substrates.

* * * * *